US012289092B2

(12) United States Patent
Sansa Perna et al.

(10) Patent No.: US 12,289,092 B2
(45) Date of Patent: Apr. 29, 2025

(54) CLOCK DEVICE

(71) Applicant: Commissariat à l'Energie Atomique et aux Energies Alternatives, Paris (FR)

(72) Inventors: Marc Sansa Perna, Grenoble (FR); Philippe Robert, Grenoble (FR)

(73) Assignee: COMMISSARIAT À L'ENERGIE ATOMIQUE ET AUX ENERGIES ALTERNATIVES, Paris (FR)

(*) Notice: Subject to any disclaimer, the term of this patent is extended or adjusted under 35 U.S.C. 154(b) by 83 days.

(21) Appl. No.: 17/757,308

(22) PCT Filed: Dec. 10, 2020

(86) PCT No.: PCT/EP2020/085612
§ 371 (c)(1),
(2) Date: Jun. 14, 2022

(87) PCT Pub. No.: WO2021/122331
PCT Pub. Date: Jun. 24, 2021

(65) Prior Publication Data
US 2022/0416150 A1   Dec. 29, 2022

(30) Foreign Application Priority Data
Dec. 16, 2019 (FR) ....................... 1914510

(51) Int. Cl.
*H03H 9/02* (2006.01)
*H03H 9/24* (2006.01)
(52) U.S. Cl.
CPC . *H03H 9/02259* (2013.01); *H03H 2009/0244* (2013.01); *H03H 9/2436* (2013.01); *H03H 2009/2442* (2013.01)

(58) Field of Classification Search
CPC ............ H03H 9/02259; H03H 9/2436; H03H 9/02157; H03H 9/02448; H03H 9/02338; H03H 2009/0244; H03H 2009/2442; H03H 2009/02503; H03H 2009/02385; H03H 2009/02496
See application file for complete search history.

(56) References Cited

U.S. PATENT DOCUMENTS

| 7,990,232 | B1 | 8/2011 | Seungbae |
| 8,947,176 | B2* | 2/2015 | Hentz ................ H03H 3/0072 333/186 |
| 9,945,822 | B2* | 4/2018 | Andreucci ............ G01N 30/64 |
| 2012/0092082 | A1 | 4/2012 | Hentz et al. |

(Continued)

FOREIGN PATENT DOCUMENTS

WO   2011048132 A1   4/2011

OTHER PUBLICATIONS

Translation of the Written Opinion of the International Searching Authority for International Application No. PCT/EP2020/085612, 7 pages.

(Continued)

*Primary Examiner* — Jeffrey M Shin
(74) *Attorney, Agent, or Firm* — Jordan IP Law, LLC

(57) ABSTRACT

The present description concerns a clock signal generation device (902) comprising: a microelectromechanical resonant element (504); and at least one nanoelectromechanical transduction element (512).

15 Claims, 7 Drawing Sheets

(56) References Cited

U.S. PATENT DOCUMENTS

2012/0105163 A1* 5/2012 Steeneken ............ H03H 9/2436
716/132
2019/0229701 A1* 7/2019 Li ...................... H03H 9/02433

OTHER PUBLICATIONS

International Search Report for International Application No. PCT/EP2020/085612 dated Mar. 10, 2021, 3 pages.

Ziaei-Moayyed, M., et al. "Fully differential internal electrostatic transduction of a Lamé-mode resonator." 2009 IEEE 22nd International Conference on Micro Electro Mechanical Systems. IEEE, 2009. pp. 931-934.

Lehée, Guillaume, et al. "Transduction performance of piezoresistive silicon nanowires on the frequency resolution of a resonant MEMS sensor." 2015 IEEE Sensors. IEEE, 2015. 4 pages.

* cited by examiner ly equalUS 12,289,092 B2

CLOCK DEVICE

FIELD

The present disclosure generally concerns electronic devices and, more particularly, clock signal generation devices, or clock devices.

BACKGROUND

A clock device is an electronic device generally enabling to generate a periodic signal of constant frequency, called clock signal. In certain applications, this clock signal is used as a synchronization signal. In other applications, for example, in the telecommunications field, advantage is taken of this clock signal to select transmission channels at specific frequencies.

Current clock devices, particularly based on quartz, are generally well adapted to the generation of clock signals having a frequency smaller than one megahertz. These devices however have a low performance in frequency ranges higher than one megahertz, for example, in the order of some ten megahertz, or even of some hundred megahertz.

SUMMARY

There is a need to improve current clock devices.

An embodiment overcomes all or part of the disadvantages of known clock devices.

An embodiment provides a clock signal generation device comprising:
a microelectromechanical resonant element; and
at least one nanoelectromechanical transduction element.

According to an embodiment, the resonant element, of planar shape, is parallel to a surface of a substrate.

According to an embodiment, the resonant element has square-extensional vibration modes parallel to the surface of the substrate.

According to an embodiment, the resonant element is coupled to the substrate by the transduction element.

According to an embodiment, the resonant element is coupled to the substrate by at least one beam, the beam being held, at each end, by anchorages located at the surface of the substrate.

According to an embodiment, the ends of the transduction element are respectively coupled to the substrate and to the beam, the transduction element being perpendicular to the beam.

According to an embodiment, the resonant element is further coupled to the substrate by a pillar located, preferably, vertically in line with the center of gravity of the resonant element.

According to an embodiment, the resonant element has, in top view, a polygonal shape, preferably a parallelogram shape, more preferably still a square shape.

According to an embodiment, the resonant element has a natural frequency in the range from 1 MHz to 100 MHz, preferably in the range from 10 MHz to 100 MHz, more preferably equal to approximately 20 MHz.

According to an embodiment, the resonant element is, in top view, square-shaped and has: a side length in the range from 2 µm to 1 mm, preferably equal to approximately 200 µm; and a thickness in the range from 200 nm to 500 µm, preferably equal to approximately 10 µm.

According to an embodiment, each transduction element forms a cuboid having: a length in the range from 500 nm to 100 µm, preferably equal to approximately 5 µm; and a width in the range from 50 nm to 50 µm, preferably equal to approximately 250 nm; and a height in the range from 50 nm to 50 µm, preferably equal to approximately 250 nm.

According to an embodiment, each transduction element is a piezoresistive strain gauge.

An embodiment provides an electronic circuit comprising at least one device such as described.

An embodiment provides a method of manufacturing a device such as described, comprising a step of:
forming the resonant microelectromechanical elements from a first layer; and
forming the nanoelectromechanical transduction element from a second layer,
the second layer having a thickness at least ten times smaller, preferably approximately forty times smaller, than the thickness of the first layer.

BRIEF DESCRIPTION OF THE DRAWINGS

The foregoing features and advantages, as well as others, will be described in detail in the rest of the disclosure of specific embodiments given by way of illustration and not limitation with reference to the accompanying drawings, in which.

DETAILED DESCRIPTION OF THE PRESENT EMBODIMENTS

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, the use which is made of the signals generated by the described clock devices is not detailed.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following description, when reference is made to terms qualifying absolute positions, such as terms "front", "back", "top", "bottom", "left", "right", etc., or relative positions, such as terms "above", "under", "upper", "lower", etc., or to terms qualifying directions, such as terms "horizontal", "vertical", etc., unless otherwise specified, it is referred to the orientation of the drawings.

Unless specified otherwise, the expressions "around", "approximately", "substantially" and "in the order of" signify within 10%, and preferably within 5%.

Figure 1:
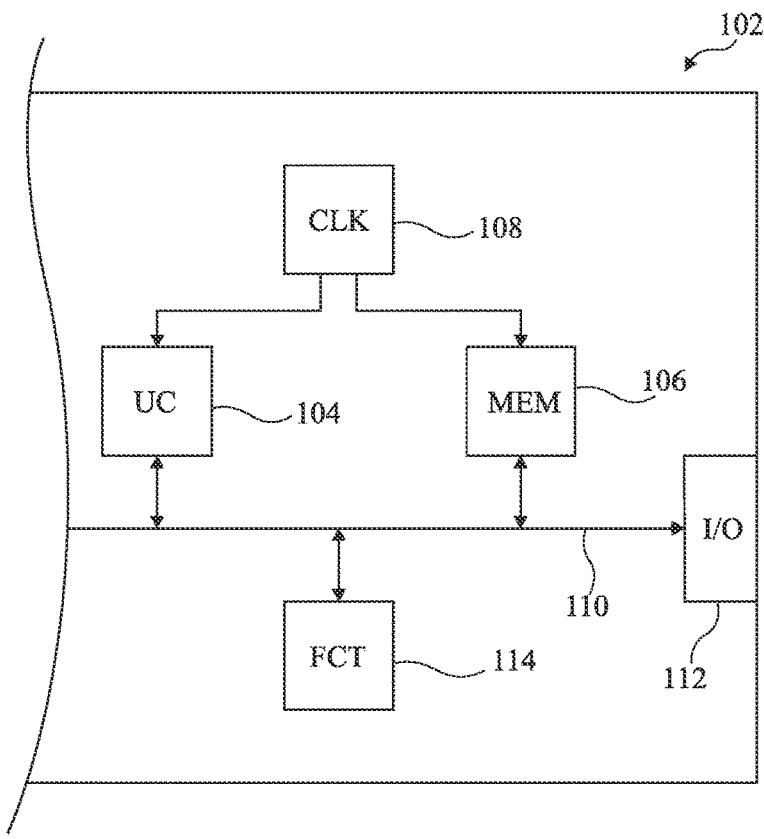
FIG. 1 schematically shows, in the form of blocks, an example of an electronic circuit of the type to which the embodiments which will be described apply as an example.

FIG. 1 very schematically shows, in the form of blocks, an example of an electronic circuit 102 of the type to which the described embodiments apply as an example. The electronic circuit 102 illustrated in FIG. 1 comprises:

- a calculation entity 104 (UC), for example, a state machine, a microprocessor, a programmable logic circuit, etc.;
- a memory 106 (MEM), for example, a memory formed of one or a plurality of volatile and/or non-volatile storage areas enabling to store program code instructions, variables, constants, etc.;
- a clock device 108 (CLK) coupled or connected to calculation entity 104 and to memory 106;
- one or a plurality of data, address, and/or control buses 110 between the different elements internal to circuit 102; and
- an input-output interface 112 (I/O) for communicating with the outside of circuit 102.

As can be shown in FIG. 1, electronic circuit 102 may further include various other circuits according to the application. These circuits are, in FIG. 1, symbolized by a single functional block 114 (FCT).

The clock device 108 of circuit 102 is typically used to generate a clock signal, or synchronization signal, for example, a periodic signal of constant frequency. This clock signal, generated by device 108, for example enables to rate data exchanges between calculation entity 104 and memory 106. The signal transmitted by clock device 108 may in particular be used by calculation entity 104 to execute operations comprising writing, reading, or erasing data into and from memory 106.

Figure 2:
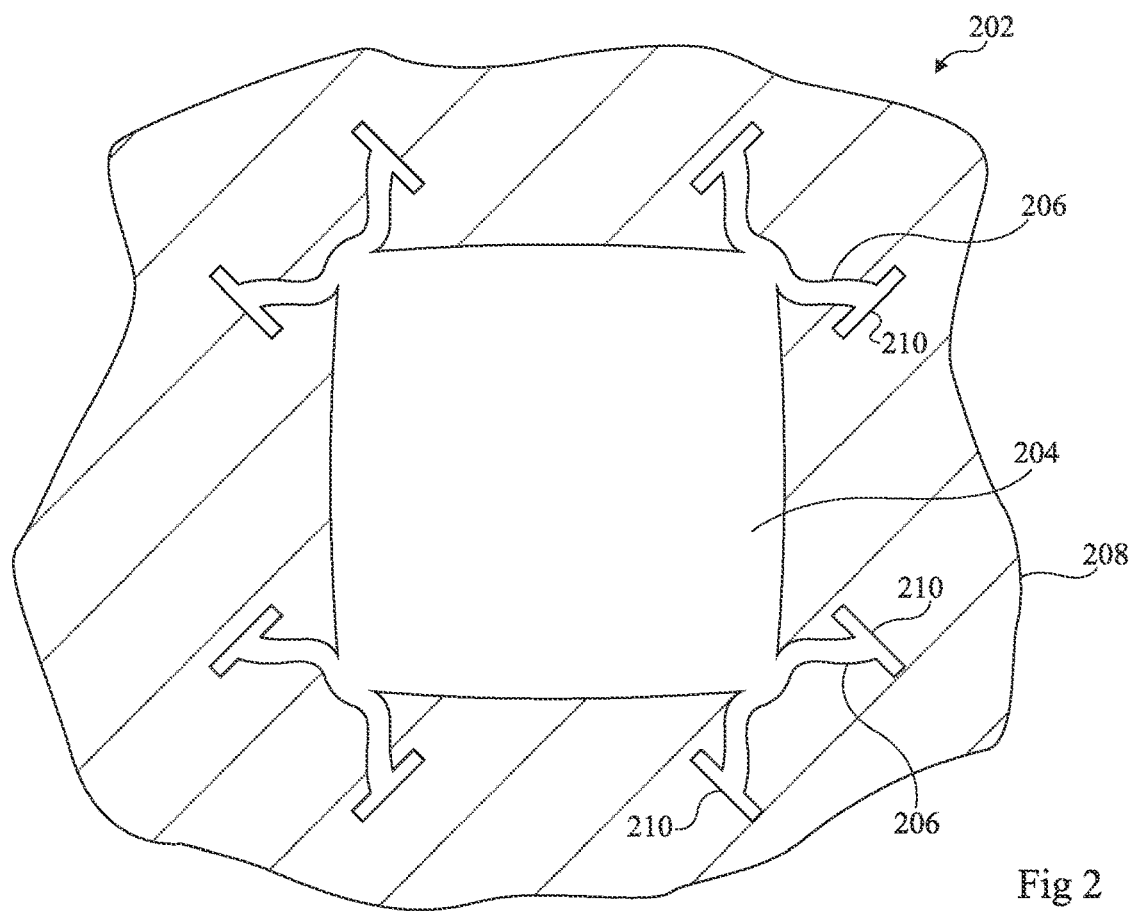
FIG. 2 is a partial simplified top view of an example of a clock device.

FIG. 2 is a partial simplified top view of an example of a clock device 202.

In the example of FIG. 2, clock device 202 comprises a square-shaped plate 204, or wafer. Each corner, in other words, each angle, of plate 204 ends with a beam 206 arranged perpendicularly to the diagonal of the square running through this corner. The ends of each beam 206 are respectively maintained rigidly attached to a substrate 208 by anchorages 210. Plate 204 and beams 206 are for example formed from a same layer. In this case, plate 204 and beams 206 form together a same mechanical part, generally called "seismic mass".

In FIG. 2, a hatched area 208 symbolizes a surface portion of the substrate. In top view in FIG. 2, plate 204 is located on substrate 208, parallel to the surface of substrate 208. Plate 204 is held, for example, a few micrometers or a few centimeters above the surface of substrate 208, so that plate 204 overhangs the surface of substrate 208 without touching it.

In the example of clock device 202, plate 204 and beams 206 each have a micrometer-range thickness, for example, equal to approximately 50 µm. Clock device 202 is then called microelectromechanical system (MEMS). Plate 204 and beams 206 form, due to their micrometer-range thicknesses, a flexible structure, capable of deforming under the effect of outer strain.

Figure 3:
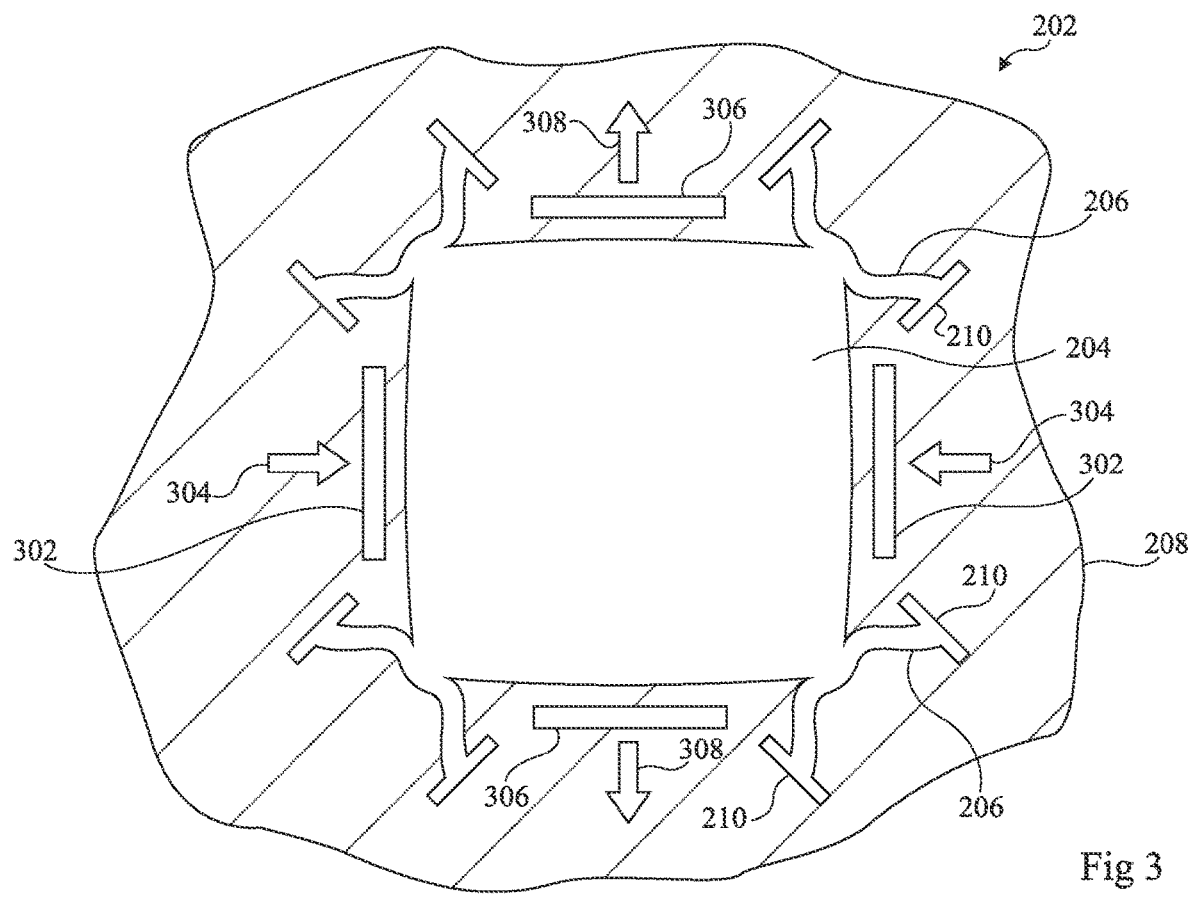
FIG. 3 is a partial simplified top view illustrating an example of operation of the clock device of FIG. 2.

FIG. 3 is a partial simplified top view illustrating an example of operation of the clock device 202 of FIG. 2.

In this example of operation, two electrodes 302 are arranged on either side of plate 204, parallel to two opposite sides of plate 204. Electrodes 302 are submitted to an excitation signal, or actuation signal, symbolized, in FIG. 3, by arrows 304. Excitation signal 304 is for example a sinusoidal AC electric voltage. Each electrode 302 then generates a variable electrostatic field, making plate 204 vibrate. It is then said that plate 204 forms a resonant element, or resonator, of clock device 202.

Under the effect of the variable electrostatic field created by electrodes 302, areas of plate 204 extend and retract in turns, periodically, for example mainly in a plane parallel to the surface of substrate 208, while the thickness of plate 204 remains substantially constant. It is then said that plate 204 vibrates in "square-extensional mode", or "breathing mode". Plate 204 for example vibrates more precisely in a bulk square-extensional mode. In this case, the electrostatic field for example imposes to plate 204 constriction and expansion motions, for example oscillatory, in all three directions of space. These motions for example have a greater amplitude in the two dimensions parallel to the surface of the substrate 208 than in the dimension orthogonal to the surface of the substrate 208.

In the example of FIG. 3, two other electrodes 306 are arranged on either side of plate 204, parallel to the two other opposite sides of plate 204. Each electrode 306 forms, with plate 204, a capacitor having one plate formed by the considered electrode 306, and having its other plate formed by plate 204. Electrodes 306, assumed to be fixed with respect to substrate 208, are then called capacitive detection electrodes.

The distance separating plate 204 from each electrode 306, that is, the distance separating the two plates of each capacitor jointly formed by an electrode 306 and by plate 204, varies periodically, at the rate of the extension and retraction motions imposed to plate 204 by the excitation signal 304 applied on electrodes 302. This causes a periodic capacitance variation of the capacitors formed by electrodes 306 and by plate 204, thus enabling device 202 to generate a clock signal. The detection of this periodic capacitance value is symbolized, in FIG. 3, by arrows 308.

In the example of device 202, electrodes 302 are separated from plate 204 by an average distance typically in the range from 1 µm to 10 µm. This enables excitation electrodes 302 to generate their electrostatic field at closest to plate 204, without interfering with its vibratory motions. A maximum vibration amplitude is thus obtained.

Still in the example of device 202, electrodes 306 are separated from plate 204 by an average distance typically shorter than 1 µm. This enables electrodes 306 to detect a capacitance variation which is the highest possible. However, the forming of electrodes 306 close to plate 204 requires, in practice, high-resolution photolithography techniques, which are often complex and expensive to implement.

One of the parameters defining the performance of clock device 202 is called clock jitter. Assuming that clock device 202 outputs a clock signal of substantially constant frequency, noted f0, the clock jitter corresponds to the frequency noise, noted <δf/f0>, for a given measurement duration. The clock jitter thus sets a minimum frequency or time resolution that clock device 202 is capable of reaching.

The clock jitter of device 202 generally depends on two preponderating types of factors: factors called "deterministic", for example, frequency drifts caused by temperature variations; and factors called "non-deterministic", for example, due to ambient noise.

It is thus desired to decrease as much as possible the influence of these two types of factors, to obtain a clock device 202 as accurate and as frequency-stable as possible.

Non-deterministic factors are typically measured in terms of phase noise noted L(f), where L represents a Laplace transform and where f represents a frequency. A low phase noise L(f) enables to lower frequency noise <δf/f0>, and thus to obtain a clock device 202 of higher quality.

Phase noise L(f) is inversely proportional to the signal-to-noise ratio (SNR) of the clock signal generated by device 202. This signal-to-noise ratio is difficult to anticipate since it particularly depends on mechanical properties of resonator 204 and on the electric performance of a feedback loop (not shown in FIG. 3) of clock device 202. However, to increase the signal-to-noise ratio, it is generally desired to optimize as a priority the properties of resonator 204. This enables to have to impose lighter constraints on the feedback loop of clock device 202.

For a given excitation signal 304, the level of the output signal of resonator 204 mainly depends on two parameters:
the quality factor, noted Q, of resonator 204, defined by a width at half maximum of the frequency response of resonator 204, this width at half maximum being linked to an energy dissipation; and
the transduction efficiency of clock device 202.

To obtain a high signal level at the output of clock device 202, it is thus particularly important to improve the quality factor Q of resonator 204. For this purpose, the structure jointly formed by plate 204 and beams 206 is generally excited close to the resonance frequency, or natural frequency, of this structure. One thus obtains, for a given excitation signal 304, vibratory motions of maximum amplitude. In a MEMS structure such as described in relation with FIGS. 2 and 3, the resonance frequency is typically around some ten megahertz.

A disadvantage of clock device 202 lies in the fact that the structure jointly formed by plate 204 and beams 206 generally generates vibrations of small amplitude, even when this structure is excited close to its resonance frequency. This complicates the detection, by electrodes 306, of the motions of plate 204, thus decreasing the level of the clock signal at the output of device 202.

Another disadvantage of clock signal 202 lies in the fact that anchorages 210 tend to stiffen the structure jointly formed by plate 204 and beams 206. This causes mechanical losses, thus negatively impacting the quality factor Q of clock device 202.

Figure 4:
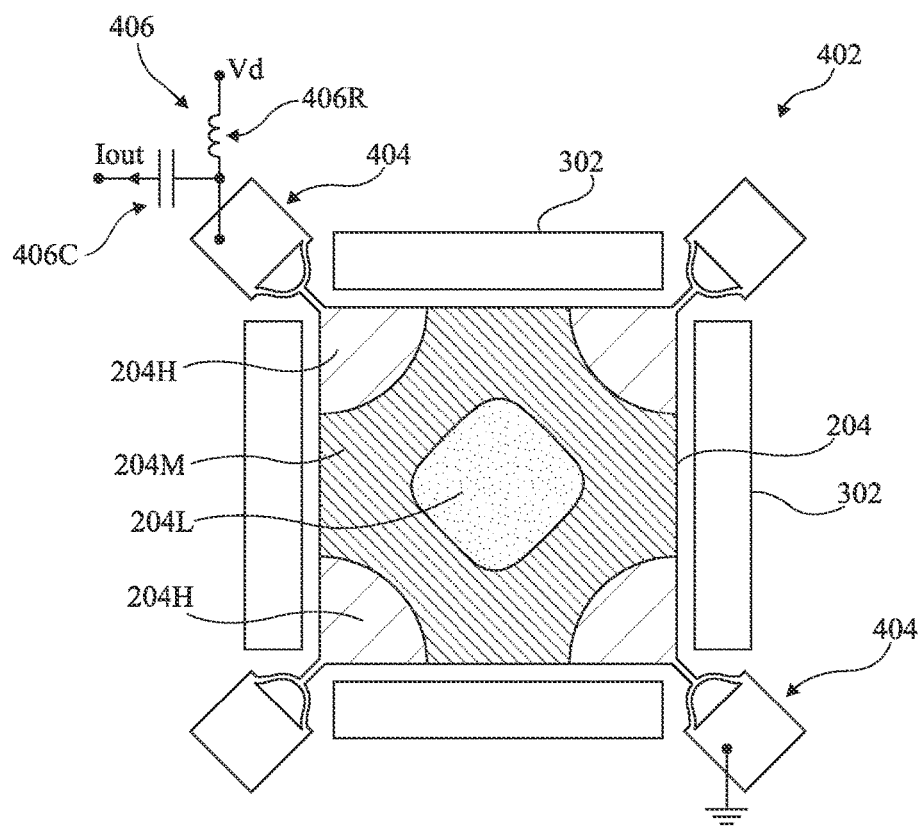
FIG. 4 is a partial simplified top view of another example of a clock device.

FIG. 4 is a partial simplified top view of another example of a clock device 402. The clock device 402 of FIG. 2 comprises elements common with the clock device 202 of FIG. 3. These common elements will not be detailed again hereafter. For clarity, substrate 208 has not been shown in FIG. 4.

The clock device 402 of FIG. 4 differs from the clock device 202 of FIG. 3 mainly in that, in the case of clock device 402, the detection of the vibrations of plate 204 is performed not due to electrodes 306, but by piezoresistive anchorages 404 arranged at the four corners of plate 204. In clock device 402, capacitive detection electrodes 306 are omitted, which for example enables to place an excitation electrode 302 parallel to each side of the square formed by plate 204.

In FIG. 4, different vibration areas of plate 204 when device 202 is in operation have been shown. More specifically:
a non-hatched area 204L symbolizes a region of plate 204 submitted to vibrations of small amplitude;
hatched areas 204H symbolize regions of plate 204 submitted to vibrations of strong amplitude, that is, having an amplitude greater than that of area 204L; and
another hatched area 204M symbolizes a region of plate 204 submitted to vibrations of medium amplitude, that is, having an amplitude between those of areas 204L and 204H.

Areas 204L, 204M, and 204H illustrate a vibration mode of plate 204. To optimize the detection in this vibration mode, the piezoresistive anchorages 404 of clock device 402 are linked to hatched areas 204H, in other words, where the vibrations of plate 204 are the most intense.

A readout circuit 406 connected to one of anchorages 404 of device 402 enables to extract, from the vibrations of plate 204, the clock signal. In the example illustrated in FIG. 4, readout circuit 406 comprises:
a resistor 406R connected between anchorage 404 and a node of application of a potential noted Vd; and
a capacitor 406C, connected between anchorage 404 and another node, conducting a current noted Iout.

In this example, the anchorage 404 diagonally opposite to the anchorage 404 having readout circuit 406 connected thereto is taken to a reference potential, here, the ground.

Clock device 402 generally has a higher performance at high frequency and is easier to manufacture than clock device 202. However, a disadvantage of clock device 402 lies in the fact that anchorages 404 ensure both mechanical hold and transduction functions, which tends to hinder the vibratory motion of plate 204. It is then spoken to a feedback phenomenon, since piezoresistive anchorages 404 disturb the vibrations of plate 204 that they are themselves supposed to detect.

Figure 5:
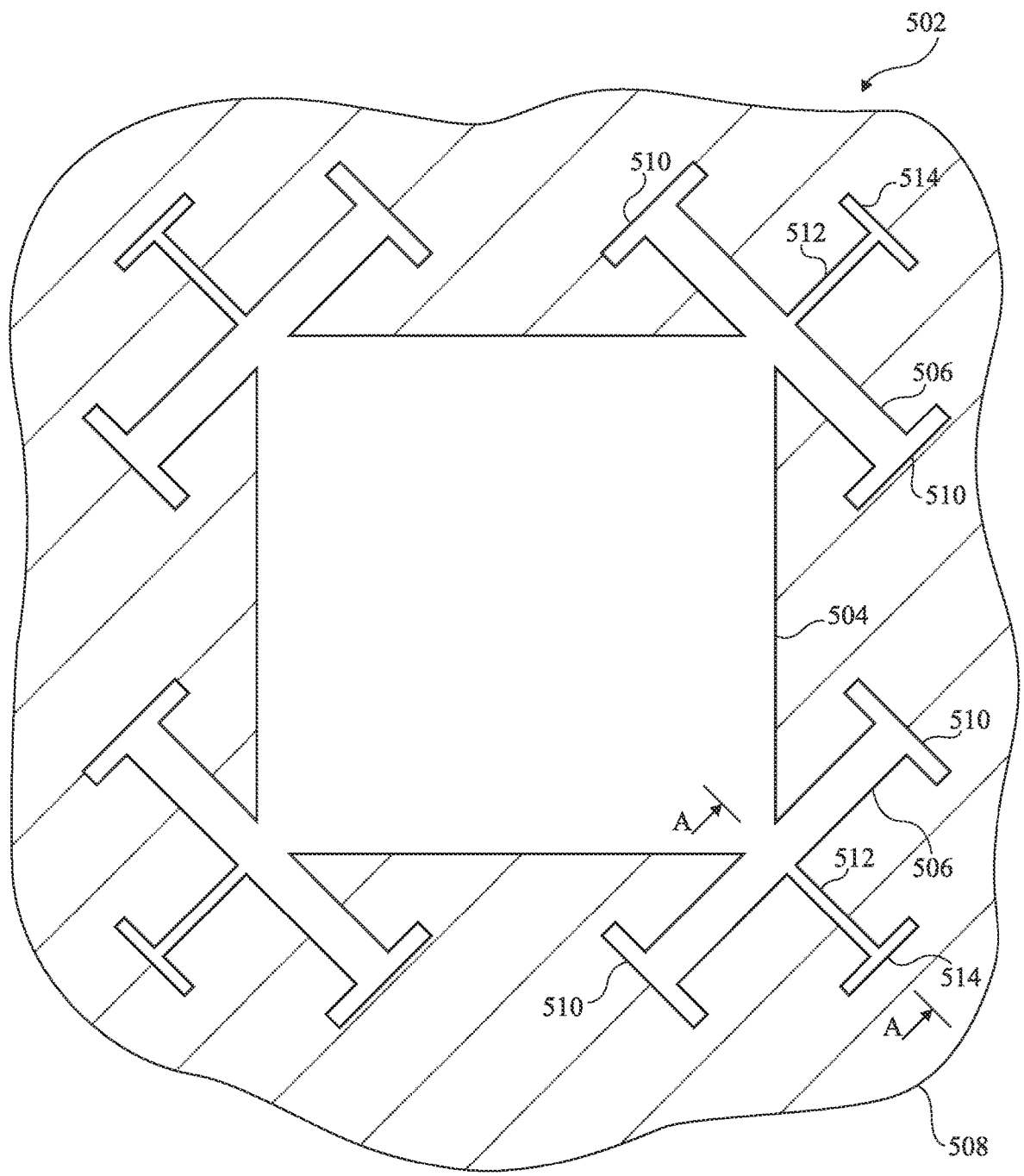
FIG. 5 is a partial simplified top view of an embodiment of a clock device.

FIG. 5 is a partial simplified top view of an embodiment of a clock device 502.

Clock device 502 comprises a planar resonant element 504 having, in top view in FIG. 5, a preferably square shape. Each corner, in other words, each angle, of resonant element 504 ends with a beam 506 arranged perpendicularly to the diagonal of the square running through this corner. The ends of each beam 506 are respectively coupled to a substrate 508 by anchorages 510 perpendicular to the axis of beams 506. Resonant element 504 and portions 506 are for example formed from a same layer. In this case, resonant element 504 and beams 506 jointly form a same mechanical part.

In FIG. 5, a hatched area 508 symbolizes a surface portion of substrate 508. In top view in FIG. 5, resonant element 504 is located on substrate 508, parallel to the surface of substrate 508. Resonant element 504 is held, for example, a few micrometers or a few millimeters above the surface of substrate 508, so that resonant element 504 overhangs the surface of substrate 508 without touching it.

In clock device 502, resonant element 504 and beams 506 have a thickness in the range from 200 nm to 500 μm, preferably equal to approximately 10 μm. The square-shaped resonant element has a side length in the range from 2 μm to 1 mm, preferably equal to approximately 200 μm. Beams 506 have, in top view in FIG. 5, a width in the range from 1 μm to 5 μm, preferably equal to approximately 3 μm, and a length in the range from 10 µm to 70 µm, preferably equal to approximately 40 µm. Due to their micrometer-range thickness, the resonant element 504 and the beams 506 of clock device 502 jointly form a microelectromechanical system, or MEMS. In particular, resonant element 504 is called microelectromechanical resonant element.

According to an embodiment, resonant element 504 and beams 506 have the same thickness. As a variant, beams 506 have a thickness smaller than that of resonant element 504.

According to an embodiment, a transduction element 512, preferably a piezoresistive transduction element, is coupled to each beam 506. As illustrated in FIG. 5, transduction elements 512 are arranged perpendicularly to beams 506, continuing the diagonals of the square formed by resonant element 504. Each transduction element is further coupled to substrate 508 by an anchorage 514. In the rest of the disclosure, piezoresistive transduction elements 512 are also called piezoresistive gauges or strain gauges.

According to a preferred embodiment, transduction elements 512 each form a cuboid having a length in the range from 500 nm to 100 µm, preferably equal to approximately 5 µm, a width in the range from 50 nm to 50 µm, preferably equal to approximately 250 nm, and a height, or thickness, in the range from 50 nm to 50 µm, preferably equal to approximately 250 nm. By length of transduction element 512, there is meant the dimension of element 512 between anchorage 514 and beam 506 and by height or thickness of transduction element 512, there is meant the dimension of element 512 perpendicular to the surface of substrate 508.

Transduction elements 512 preferably have identical dimensions, to within manufacturing dispersions. Due to their nanometer-range widths and heights, the transduction elements of clock device 502 are called nanoelectromechanical systems (NEMS), or nanoelectromechanical transduction elements.

To generate a clock signal, resonant element 504 is vibrated in a plane parallel to the surface of substrate 508, in other words in "square-extensional mode", or "breathing mode", as previously discussed. Generally, the vibration of resonant element 504 is obtained due to an electric (current or voltage) excitation signal. This signal is modulated to excite resonant element 504 at a frequency approximately equal to its resonance frequency. Resonant element 504 for example has a natural frequency in the range from 1 MHz to 100 MHz, preferably in the range from 10 MHz to 100 MHz, more preferably equal to approximately 20 MHz.

Device 502 is more particularly a bulk square-extensional clock signal generation device. The application of the excitation signal for example causes deformations of resonant element 504, for example, oscillatory constriction and expansion motions, in all directions of space.

In the shown example, transduction elements 512 are placed so as not to disturb the square-extensional mode of device 502. Further, transduction elements 512 have dimensions enabling not to alter the dynamics of device 502.

As an example, the transduction elements 512 of device 502 are such that the resonance frequency of device 502 is substantially identical to within 5%, preferably to within 1%, to the resonance frequency that a device 502 deprived of transduction elements 512 would have. In other words, the presence of transduction elements 512 causes a modification in the resonance frequency of device 502 smaller than 5%, preferably smaller than 1%, as compared with a case where transduction elements 512 would be omitted.

According to an embodiment, the vibration is caused by the application of a variable electrostatic field radiated by one or a plurality of electrodes positioned close to resonant element 504. According to another embodiment, the vibration is caused by a layer of piezoelectric material located under resonant element 504. As a variant, resonant element 504 is formed of a piezoelectric material capable of extending and of retracting along the variations of a control signal. According to still another embodiment, beams 506 are made of a piezoelectric material, so that a potential applied to beams 506 generates strain on beams 506 and on resonant element 504.

As a variant, beams 506 are made of an electrically-conductive material which expands when the temperature increases, beams 506 being arranged to apply strain on resonant element 504. An electric current crossing beams 506 will then tend to cause a temperature rise, and thus an expansion of beams 506. On the contrary, a lack of electric current crossing beams 506 will then tend to cause a temperature decrease, and thus a compression, of beams 506. By periodically alternating between phases where an electric current crosses beams 506 and other phases where beams 506 conduct a negligible or zero current, a vibration of resonant element 504 close to its resonance frequency may be achieved.

An advantage of clock device 502 lies in the fact that piezoresistive gauges 512 enable to reach a high transduction performance, particularly higher than the performance of the capacitive and resistive transduction systems respectively discussed in relation with FIGS. 3 and 4. Clock device 502 is further easier to manufacture than capacitive detection devices which, like the device 202 of FIG. 3, have electrodes 306 very close to plate 204.

Another advantage of device 502 lies in the fact that NEMS piezoresistive gauges 512 have dimensions significantly smaller than those of the MEMS structure jointly formed by resonant element 504 and by beams 506. This enables in particular to ascertain that NEMS piezoresistive gauges 512 have a negligible influence on the vibrations of resonant element 504, that is, gauges 512 induce no feedback phenomenon.

In the case of clock device 502, the mechanical hold, or anchorage, and transduction functions are indeed decoupled, conversely, for example, to the case of the clock device 402 of FIG. 4. This particularly enables to optimize the mechanical performance of resonance element 504 by decreasing losses linked to anchorages 510, and thus to improve the quality factor Q of clock device 502.

More generally, the association of a MEMS-type resonant element 504 and of NEMS-type transduction elements 512 enables clock device 502 to reach a better performance both in terms of transduction and in terms of quality factor Q. One thus obtains, due to clock device 502, a clock signal of better quality than the clock signal likely to be generated, for example, by clock devices 202 (FIGS. 2 and 3) and 402 (FIG. 4).

There has been shown in FIG. 5 a clock device 502 comprising a square-shaped MEMS resonant element 504, coupled to substrate 508 by four NEMS piezoresistive gauges 512. As a variant, clock device 502 comprises a MEMS resonant element 504 having any shape, particularly a polygonal shape, preferably a parallelogram shape. Further, clock device 502 may comprise any number of NEMS piezoresistive gauges 512, these gauges 512 being preferably positioned to detect a maximum vibration amplitude of MEMS resonant element 504.

Figure 6:
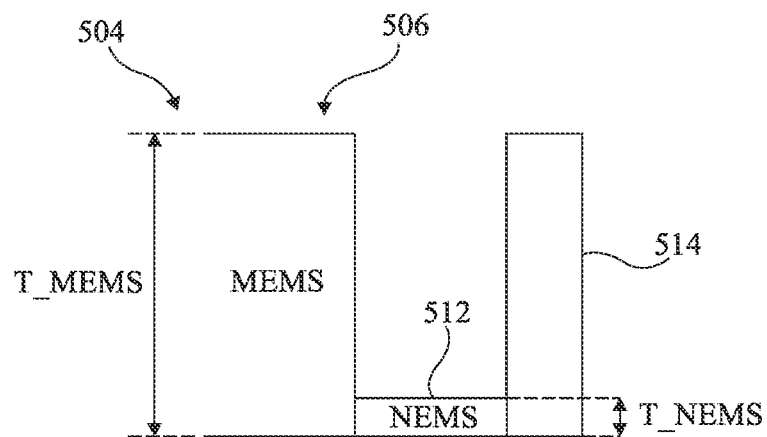
FIG. 6 is a partial simplified cross-section view of the clock device of FIG. 5.

FIG. 6 is a partial simplified cross-section view along plane AA of the clock device 502 of FIG. 5.

As illustrated in the cross-section view of FIG. 6, piezoresistive gauge 512 (NM) is interposed between, on the one hand, a structure (MEMS) jointly formed by resonant element 504 and beam 506, and, on the other hand, anchorage 514. NEMS piezoresistive gauge 512 has a thickness, noted T_NEMS, at least ten times smaller, preferably approximately forty times smaller, than the thickness, noted T_MEMS, of the MEMS structure and of anchorage 514. NEMS piezoresistive gauge 512 thus detects with a high sensitivity the vibratory motion of the MEMS structure and does not disturb, or only slightly disturbs, theses vibratory motions.

Figure 7:
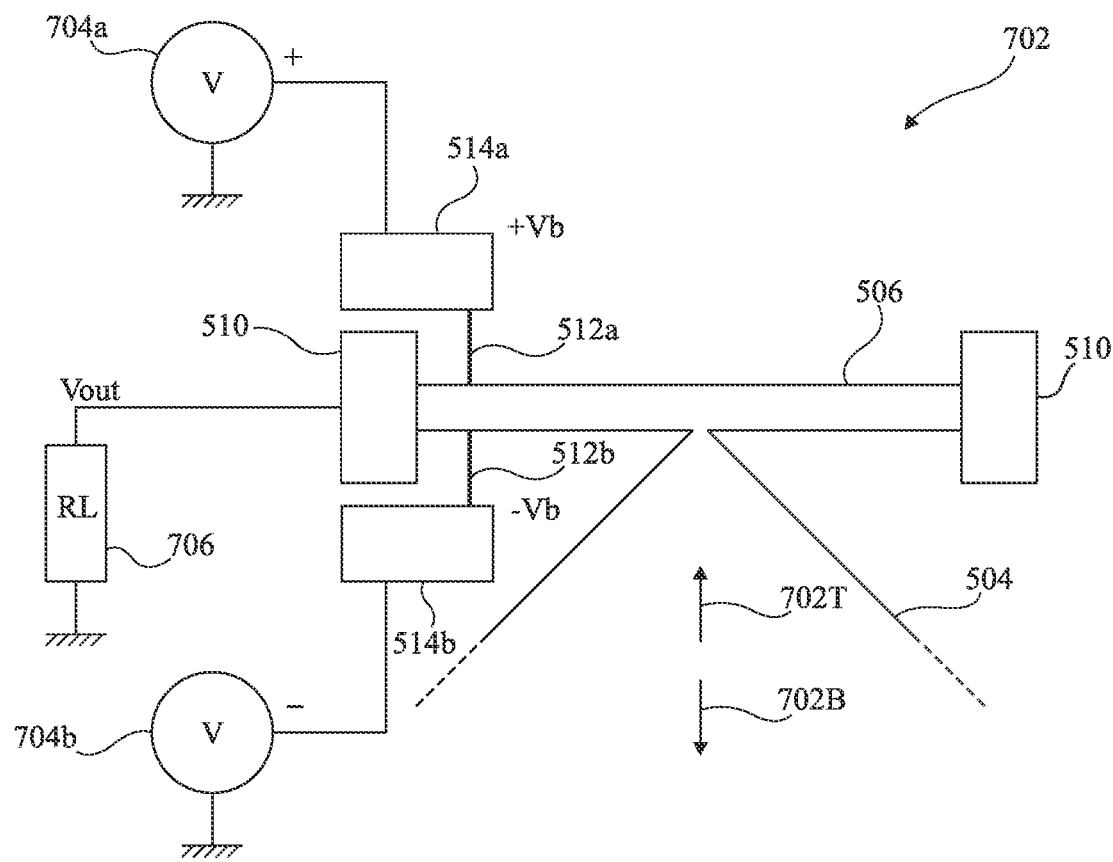
FIG. 7 is a partial simplified top view of another embodiment of a clock device.

FIG. 7 is a partial simplified top view of another embodiment of a clock device 702.

The clock device 702 of FIG. 7 comprises elements common with the device 502 of FIG. 5. These common elements will not be detailed again hereafter. The device 702 of FIG. 7 differs from the device 502 of FIG. 5 mainly in that device 702 has, at each corner of resonant element 504, two piezoresistive gauges 512a and 512b.

In FIG. 7, only one corner of the resonant element 504 of clock device 702 has been shown, it being understood that the other corners of resonant element 504 may be identical, to within manufacturing dispersions, to the corner shown in FIG. 7.

According to an embodiment, piezoresistive gauges 512a and 512b are off-centered with respect to beam 506. This enables to still further decrease the influence of piezoresistive gauges 512a and 512b on the vibratory motions of resonant element 504 and to avoid or limit the occurrence of common modes. Piezoresistive gauges 512a and 512b are respectively located face to face, on either side of beam 506. Each piezoresistive gauge 512a, 512b is arranged perpendicularly to the longitudinal direction of beam 506 and is coupled to substrate 508 (not shown in FIG. 7) by an anchorage 514a, 514b. Beam 506 is still supposed to be coupled to substrate 508, that is, held rigidly attached to substrate 508, by anchorages 510 located at each of its ends.

In the orientation of FIG. 7, when resonant element 504 extends upwards (arrow 702T), this causes a compression of piezoresistive gauge 512a and an extension of piezoresistive gauge 512b. Conversely, when resonant element 504 retracts downwards (arrow 702B), this causes an extension of piezoresistive gauge 512a and a compression of piezoresistive gauge 512b. In this configuration, called differential measurement, piezoresistive gauges 512a and 512b are submitted to strain of substantially equal amplitude and of opposite sign.

As illustrated in FIG. 7, in operation, a voltage source 704a (V) applies, to anchorage 514a, a DC electric potential, of positive value noted +Vb. Similarly, a voltage source 704b (V) applies, to anchorage 514b, a DC electric potential, of negative value noted −Vb. A resistor 706 (RL) is connected between one of the anchorages 510 of beam 506 (the anchorage 510 closest to piezoresistive gauges 512a and 512b, in FIG. 7) and the ground. The value of resistance RL is supposed to be much higher, for example, one thousand times higher, than the resistance of piezoresistive gauges 512a and 512b, noted RG.

In this configuration, each piezoresistive gauge 512a, 512b is applied a voltage of equal amplitude Vb, but of opposite sign. One thus obtains, on the anchorage 510 coupled to resistor 706, a variable potential noted Vout, having an approximately zero mean value, for example, in the range from −0.1 V to +0.1 V, preferably zero, and having an amplitude proportional to the vibration amplitude of resonant element 504.

As a variant, voltage Vb is an AC electric voltage having a frequency noted fb, frequency fb being close to the vibration frequency f0 of resonant element 504. In this variant, output voltage Vout has a frequency component equal to f0−fb. This advantageously enables to use readout circuits operating at low frequencies.

According to an embodiment, MEMS resonant element 504 is made of silicon. The NEMS piezoresistive gauges 512a and 512b of clock device 702 are preferably made of the same material a MEMS resonant element 504. As a variant, NEMS piezoresistive gauges 512a and 512b are made of a piezoresistive material other than that forming MEMS resonant element 504.

Figure 8:
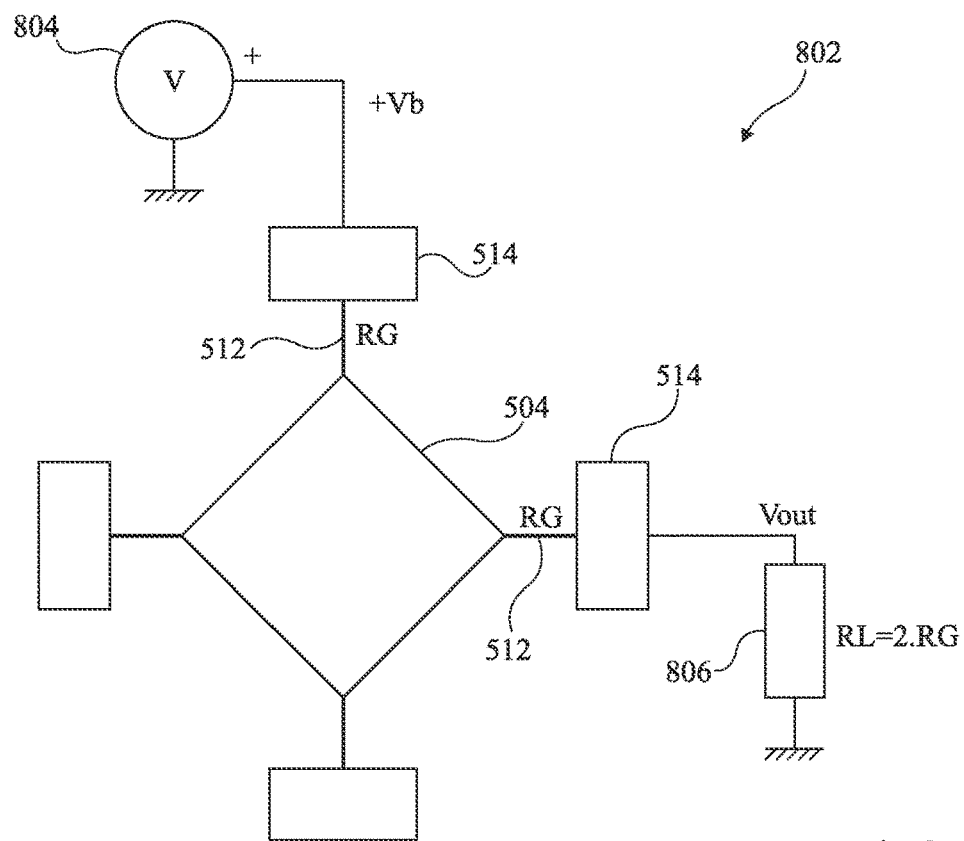
FIG. 8 is a partial simplified top view of still another embodiment of a clock device.

FIG. 8 is a partial simplified top view of still another embodiment of a clock device 802.

The clock device 802 of FIG. 8 comprises elements common with the device 502 of FIG. 5. These common elements will not be detailed again hereafter. The device 802 of FIG. 8 differs from the device 502 of FIG. 5 mainly in that, in device 802, beams 506 are omitted. Each corner of the resonant element 504 of clock device 802 is thus coupled to substrate 508 (not shown in FIG. 8) by a piezoresistive gauge 512 of resistance RG. As in the device 502 of FIG. 5, each piezoresistive gauge 512 of device 802 is held rigidly attached to substrate 508 by an anchorage 514.

According to an embodiment, resonant element 504 is coupled to substrate 508 by a central pillar (not shown in FIG. 8). This advantageously enables to decouple the mechanical anchoring function, performed by the central pillar, from the transduction function, ensured by piezoresistive gauges 512. In other words, in this case, gauges 512 do not take part, or only slightly take part, in the mechanical anchoring function.

In clock device 802, a voltage source 804 (V) imposes on one of its anchorages 514 a positive voltage, noted +Vb. Another anchorage 514 of device 802 is coupled to ground via a resistor 806 of value RL. The value RL of resistor 806 is selected to be equal to approximately twice the resistance RG of a piezoresistive gauge 512 (RL=2.RG). An output voltage Vout is measured across resistor 806.

The two gauges 512 respectively coupled to voltage source 804 and to resistor 806 are then said to be connected in a "Wheatstone half-bridge," resistor 806 here being used as a second resistor of the bridge. When resonant element 504 starts vibrating, the output voltage Vout of the Wheatstone half-bridge will have an oscillating component with an amplitude proportional to the mechanical vibration of resonant element 504.

As discussed in relation with FIG. 7, voltage Vb may be a DC voltage or an AC voltage.

The transduction of the vibratory motion of the resonant element 504 of clock device 802 is performed due to piezoresistive gauges 512. Under the action of the vibrations of resonant element 504, all piezoresistive gauges 512 alternately undergo substantially identical tensile and compressive strain. This strain causes periodic variations of the resistance RG of piezoresistive gauges 512, which enable to generate a clock signal.

The piezoresistive gauges 512 of clock device 802 both fulfill a transduction function and a mechanical hold function. However, unlike the clock device 402 of FIG. 4, it is here ascertained that the assembly of piezoresistive gauges 512 has a negligible compression stiffness, that is, at least ten times smaller than the stiffness of the vibration mode of resonant element 504. The feedback problems previously described in relation with FIG. 4 are thus done away with.

In clock device 802, resonant element 504 for example has a vibration mode at a frequency f0 equal to approximately 20 MHz, with a stiffness equal to approximately $3.6 \cdot 10^7$ N·m$^{-1}$. The four piezoresistive gauges 512 have together a compression stiffness for example equal to approximately $5 \cdot 10^3$ N·m$^{-1}$, in other words a stiffness several thousand times smaller than that of the vibration mode of resonant element 504. More generally, the stiffness of resonant element 504 is at least one thousand times greater than that of a piezoresistive gauge 512.

Figure 9:
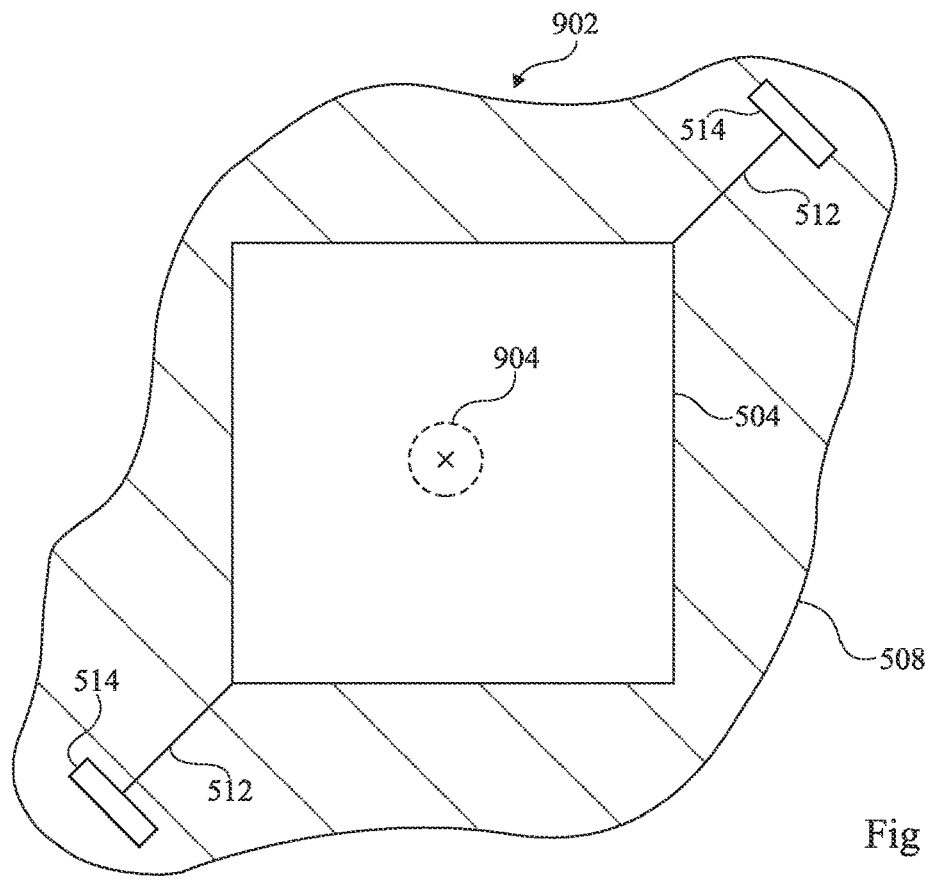
FIG. 9 is a partial simplified top view of still another embodiment of a clock device.

FIG. 9 is a partial simplified top view of still another embodiment of a clock device 902.

The clock device 902 of FIG. 9 comprises elements common with the device 802 of FIG. 8. These common elements will not be detailed again hereafter. The device 902 of FIG. 9 differs from the device 802 of FIG. 8 mainly in that device 902 is coupled to substrate 508 by only two diagonally opposite piezoresistive gauges 512.

According to an embodiment, resonant element 504 is further coupled to substrate 508 by a pillar 904 represented, in FIG. 9, by a circle in dotted lines. Pillar 904 is preferably a cylindrical central pillar, located vertically in line with the center of gravity of resonant element 504.

Pillar 904 is advantageously coupled to an area where resonant element 504 undergoes a minimum deformation in the considered vibration mode. This particularly enables to ascertain that pillar 904 has a negligible impact on the vibration mode of resonant element 504, in other words, that pillar 904 does not practically hinder the vibratory motions of resonant element 504. Losses due to the coupling of resonant element 504 to substrate 508 are thus avoided, while improving the mechanical strength of clock device 902.

FIG. 9 shows a clock device 902 comprising a square-shaped MEMS resonant element 504, coupled to substrate 508 by two NEMS piezoresistive gauges 512. As a variant, clock device 902 comprises a MEMS resonant element 504 having any shape, particularly a polygonal shape, preferably a parallelogram shape. Further, clock device 902 may comprise any number of NEMS piezoresistive gauges 512, these gauges 512 being preferably positioned to detect a maximum vibration amplitude of MEMS resonant element 504.

The clock devices 502, 702, 802, and 902 respectively described in relation with FIGS. 5, 7, 8, and 9 are preferably formed by implementing a method such as that described in patent application No. WO2011048132, which here incorporated herein by reference as authorized by law. An implementation mode of this method comprises in particular a step where resonant element 504 and beams 506 are preferably obtained from a first layer of micrometer-range thickness while piezoresistive gauges 512 are obtained from a second layer of nanometer-range thickness, that is, having a thickness at least ten times smaller, preferably approximately forty times smaller, than that of the first layer.

The use, in the circuit 102 of FIG. 1, of a clock device 108 similar to clock devices 502, 702, 802, and 902 advantageously enables to generate a high-quality clock signal at a frequency for example equal to approximately 20 MHz.

FIGS. 10 to 14 illustrate, in top view, embodiments of resonant elements 504 having various shapes and symbolize associated vibration modes. FIGS. 10 to 14 comprise an orthonormal (O,x,y,z) reference frame having its z axis perpendicular to the surface of substrate 508 (not shown), FIGS. 10 to 14 all showing views location in a plane (O,x,y) perpendicular to the z axis.

In FIGS. 10 to 14, the resonant element extends and retracts in the (O, x, y) plane parallel to substrate 508 (not shown). Resonant element 504 however undergoes no transformation along the z axis, or a transformation along the z axis negligible with respect to the transformations undergone along the x and y axes.

Figure 10:
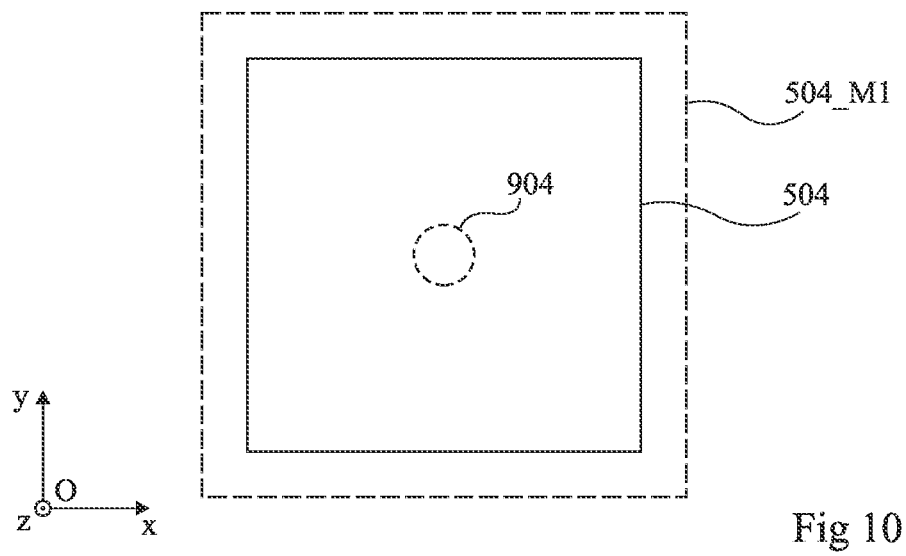
FIG. 10 is a partial simplified top view symbolizing a vibration mode of a resonant element.

FIG. 10 is a partial simplified top view symbolizing a vibration mode 504_M1 of a square-shaped resonant element 504 of the clock device 902 of FIG. 9. Resonant element 504 is supposed to be coupled to substrate 508 (not shown) by pillar 904.

During each period of the vibration mode 504_M1 symbolized in FIG. 10, resonant element 504 extends along the x and y axes, and then retracts along the x and y axes.

Figure 11:
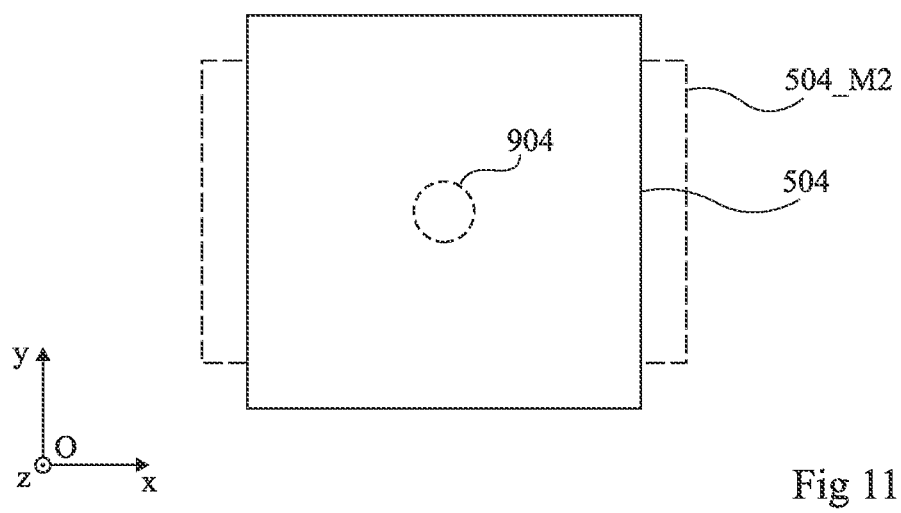
FIG. 11 is a partial simplified top view symbolizing another vibration mode or the resonant element of FIG. 10.

FIG. 11 is a partial simplified top view symbolizing another vibration mode 504_M2 of the resonant element 504 of FIG. 10.

During each period of vibration mode 504_M2, resonant element 504 extends along the x axis while it retracts along the y axis, and then retracts along the x axis while it extends along the y axis.

Generally, when advantage is desired to be taken of resonant element 504 to generate a clock signal, nanoelectromechanical transduction elements 512 are advantageously placed where the vibration amplitude is maximum for a given vibration mode. To make the most of the vibration mode 504_M1 symbolized in FIG. 10, one should for example place a transduction element 512 at each corner of resonant element 504, in continuation of the diagonals of the square formed by element 504. However, to take advantage of the vibration mode 504_M2 symbolized in FIG. 11, one had better provide transduction elements 512 perpendicular to the sides parallel to the y axis of the square formed by element 504.

Figure 12:
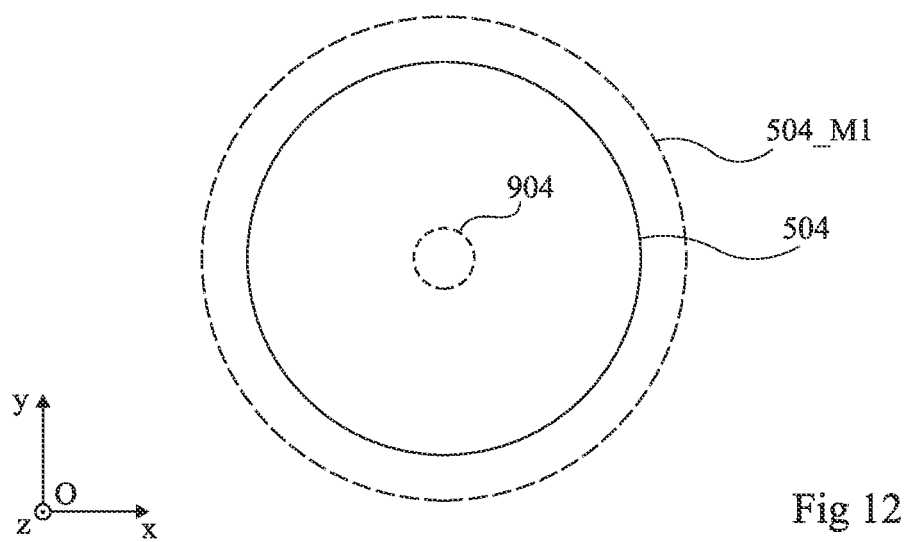
FIG. 12 is a partial simplified top view symbolizing a vibration mode of another resonant element.

FIG. 12 is a partial simplified top view symbolizing vibration mode 504_M1 in an embodiment where resonant element 504 is of circular shape.

During each period of the vibration mode 504_M1 symbolized in FIG. 12, the diameter of the disk formed by the upper surface of resonant element 504 increases and then decreases.

Figure 13:
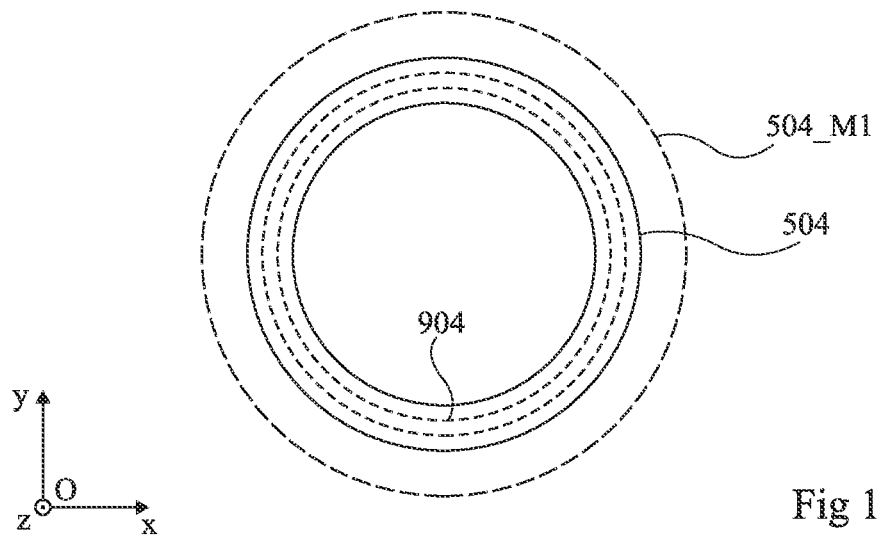
FIG. 13 is a partial simplified top view symbolizing a vibration mode of still another resonant element.

FIG. 13 is a partial simplified top view symbolizing vibration mode 504_M1 in an embodiment where resonant element 504 is ring-shaped. According to this embodiment, the pillar 904 coupling resonant element 504 to substrate 508 (not shown) is in the shape of a hollow cylinder.

During each period of the vibration mode 504_M1 symbolized in FIG. 13, the outer diameter of the ring formed by the upper surface of resonant element 504 increases and then decreases.

Figure 14:
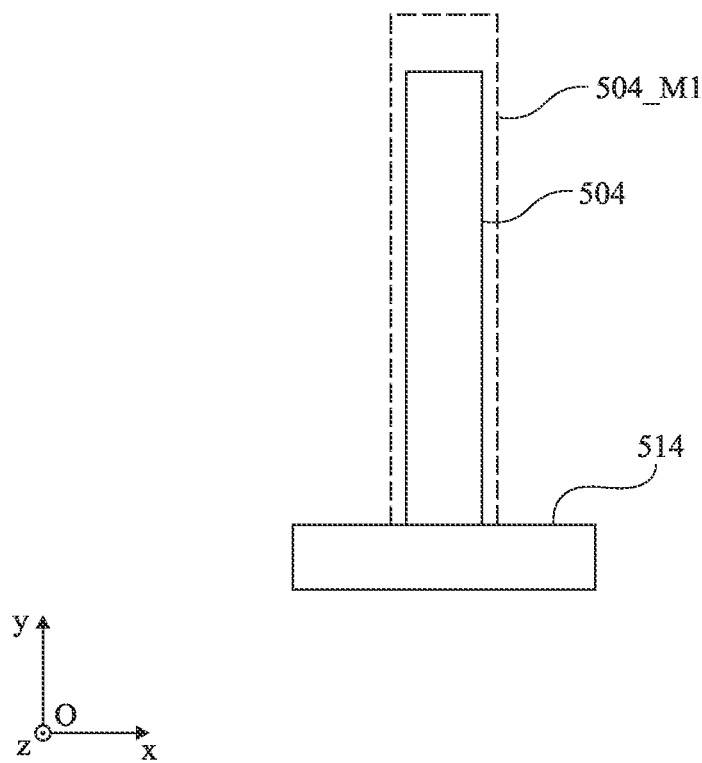
FIG. 14 is a partial simplified top view symbolizing a vibration mode of still another resonant element.

FIG. 14 is a partial simplified top view symbolizing vibration mode 504_M1 in an embodiment where resonant element 504 is of rectangular shape. According to this embodiment, the pillar 904 coupling resonant element 504 to substrate 508 (not shown) is omitted. In this case, resonant element 504 is coupled to substrate 508 by an anchorage 514 located at one of the ends, or one of the small sides, of element 504.

During each period of the vibration mode 504_M1 symbolized in FIG. 14, resonant element 504 extends and then retracts mainly along its y longitudinal direction.

To make the most of the vibration mode 504_M1 symbolized in FIG. 14, one should place a transduction element perpendicularly to the end of resonant element 504 which is not coupled to substrate 508 by anchorage 514 (the upper end of resonant element 504, in the orientation of FIG. 14).

The embodiments described hereabove in relation with FIGS. 10 to 14 are not limiting. In particular, those skilled in the art are capable of transposing these embodiments to configurations where resonant elements have any shape and/or having vibrations modes that may be different from those previously described.

Various embodiments and variants have been described. Those skilled in the art will understand that certain features of these various embodiments and variants may be combined, and other variants will occur to those skilled in the art. In particular, those skilled in the art are capable of adjusting the geometry of the microelectromechanical resonant element 504 according to the frequency f0 to be reached. Those skilled in the art are further capable of positioning the nanoelectromechanical transduction elements 512 to optimize the quality of the generated clock signal.

Finally, the practical implementation of the described embodiments and variants is within the abilities of those skilled in the art based on the functional indications given hereabove.

What is claimed is:

1. Square-extensional mode clock signal generation device comprising:
   a microelectromechanical resonant element overhanging a surface of a substrate and having, in top view, a square shape and, at each corner of the square shape, a beam arranged perpendicularly to a diagonal of the square shape running through the corner, the ends of each beam being respectively coupled to the substrate by anchorages perpendicular to an axis of the beam; and
   four nanoelectromechanical transduction elements arranged perpendicularly to the beams and continuing the diagonals of the square shape, each of the four nanoelectromechanical transduction elements being coupled to one of the beams and further coupled to the substrate by an anchorage.

2. Device according to claim 1, wherein the square-extensional mode is a bulk square-extensional mode.

3. Device according to claim 1, wherein the resonant element of planar shape, is parallel to a surface of a substrate.

4. Device according to claim 3, wherein the resonant element has square-extensional vibration modes parallel to the surface of the substrate.

5. Device according to claim 3, wherein the resonant element is coupled to the substrate by the transduction element.

6. Device according to claim 3, wherein the resonant element is further coupled to the substrate by a pillar located, preferably, vertically in line with the center of gravity of the resonant element.

7. Device according to claim 1, wherein the resonant element has, in top view, a polygonal shape, preferably a parallelogram shape, more preferably a square shape.

8. Device according to claim 1, comprising a plurality of beams each located in a corner of the resonant element.

9. Device according to claim 1, wherein the resonant element has a natural frequency in the range from 1 MHz to 100 MHz, preferably in the range from 10 MHz to 100 MHz, more preferably equal to approximately 20 MHz.

10. Device according to claim 1, wherein the resonant element is, in top view, square-shaped and has:
    a side length in the range from 2 μm to 1 mm, preferably equal to approximately 200 μm; and
    a thickness in the range from 200 nm to 500 μm, preferably equal to approximately 10 μm.

11. Device according to claim 1, wherein each transduction element forms a cuboid having:
    a length in the range from 500 nm to 100 μm, preferably equal to approximately 5 μm; and
    a width in the range from 50 nm to 50 μm, preferably equal to approximately 250 nm; and
    a height in the range from 50 nm to 50 μm, preferably equal to approximately 250 nm.

12. Device according to claim 1, wherein each transduction element is a piezoresistive strain gauge.

13. Device according to claim 1, wherein the presence of the transduction element(s) causes a modification of the resonance frequency of the device smaller than 5% with respect to a case in which the at least one transduction element is omitted.

14. Electronic circuit comprising at least one device according to claim 1.

15. Method of manufacturing a device according to claim 1, comprising a step of:
    forming the microelectromechanical resonant element from a first layer; and
    forming the nanoelectromechanical transduction element from a second layer,
    the second layer having a thickness at least ten times smaller, preferably approximately forty times smaller, than the thickness of the first layer.

* * * * *